(12) United States Patent
Maangat et al.

(10) Patent No.: US 8,049,532 B1
(45) Date of Patent: Nov. 1, 2011

(54) LEVEL SHIFTER CIRCUIT WITH A THIN GATE OXIDE TRANSISTOR

(75) Inventors: Simardeep Maangat, Sunnyvale, CA (US); Vinh Van Ho, San Jose, CA (US); Tim Tri Hoang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/823,596

(22) Filed: Jun. 25, 2010

(51) Int. Cl.
 *H03K 19/0175* (2006.01)
 *H03L 5/00* (2006.01)

(52) U.S. Cl. .......................................... 326/68; 327/333

(58) Field of Classification Search .............. 326/62–63, 326/68, 80–87; 327/333
See application file for complete search history.

(56) References Cited

U.S. PATENT DOCUMENTS

| 6,342,996 | B1* | 1/2002 | Drapkin et al. | 361/91.1 |
| 7,567,112 | B2* | 7/2009 | Shen | 327/333 |
| 7,777,549 | B2* | 8/2010 | Harada | 327/333 |
| 2008/0061832 | A1* | 3/2008 | Hu et al. | 326/83 |
| 2008/0211541 | A1* | 9/2008 | Chauhan | 326/68 |
| 2009/0128215 | A1* | 5/2009 | Hsueh | 327/333 |
| 2009/0231014 | A1* | 9/2009 | Harada | 327/333 |
| 2010/0123505 | A1* | 5/2010 | Chou et al. | 327/333 |

* cited by examiner

*Primary Examiner* — Shawki S Ismail
*Assistant Examiner* — Thienvu Tran
(74) *Attorney, Agent, or Firm* — Womble, Carlyle, Sandridge & Rice, LLP

(57) ABSTRACT

A level shifting circuit with a thin gate transistor connected to the input of the output stage is presented. The level shifting circuit has an input stage that receives an input that is at first voltage. A transistor with a thin gate oxide has one terminal connected to the input stage and another terminal coupled to an input of the output stage. The output stage of the level shifting circuit is implemented with thick gate oxide transistors.

18 Claims, 5 Drawing Sheets

LEVEL SHIFTER CIRCUIT WITH A THIN GATE OXIDE TRANSISTOR

BACKGROUND

Many integrated circuits have circuit blocks that use different supply voltages. For example, the core logic of an integrated circuit may be designed to operate using a relatively low voltage, e.g., 1.1V, while logic in a charge pump may operate using a relatively high voltage, e.g., 1.8V. In order to reduce the system complexity, the number of power supplies used to provide the different voltages may be minimized by using level shifter circuits. The difficulty of level shifting from a lower supply voltage to a higher supply voltage increases as the frequency of operation increases, especially at operating data rates of 6.5 Gbps (Gigabits per second) and above.

Ideally, a level shifter circuit should have high bandwidth as well as low power consumption. Current level shifter implementations use a mixture of thin gate oxide transistors and thick gate oxide transistors. One skilled in the art will appreciate thick gate oxide transistors are inherently slower and have lower current than a similarly sized thin gate oxide transistor. As a consequence, many of level shifter circuit implementations are performance limited by the use of thick gate oxide transistors to drive the required load at high frequency. For this reason, the thick gate oxide transistors in the level shifter circuit need to be sized larger than if thin gate transistors were used to provide the amount of current needed achieve the frequency of operation, while keeping the load the same. Additionally, the use of larger sized, thick gate oxide transistors limits the performance of the level shifter circuit because the thick gate oxide transistors lead to high capacitive loading and thus lower bandwidth. Additionally, the use of thick gate oxide transistors leads to larger amounts of current and therefore higher power consumption.

It is in this context that embodiments of the invention arise.

SUMMARY

Broadly speaking, the present invention fills these needs by providing a method and apparatus for level shifting from a low voltage input signal to a high voltage output signal an output stage with a thin gate oxide transistor. In one embodiment, the level shifting circuit is implemented using a thin gate oxide transistor coupled to the input of the buffering inverters to achieve high frequency operation. It should be appreciated that the present invention can be implemented in numerous ways, including as a method, a system, or a device. Several inventive embodiments of the present invention are described below.

In accordance with one aspect of the invention, a level shifter circuit with a thin gate transistor connected to the input of the output stage of the level shifter circuit is detailed. The level shifting circuit also has an input stage that receives an input at a first voltage. A transistor with a thin gate oxide has one terminal connected to the input stage and another terminal coupled to an input of the output stage. The output stage of the level shifting circuit is implemented with thick gate oxide transistors.

In accordance with another aspect of the invention, a method of level shifting an input at a first voltage to an output at a second voltage is provided. The method receives an input signal at a first voltage, and the gate node of a transistor coupled to an input of an output stage is biased to a reference voltage. The input of the output stage of the level shifter circuit is biased either with the second voltage or ground. In one embodiment, the bias at the input of the output stage is in phase with the bias of the source of the transistor. The level shifter circuit transmits either the second voltage or ground as dictated by the input signal.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for level shifting from a low voltage input signal to a high voltage output signal using an output stage with a thin gate oxide transistor. It will be obvious, however, to one skilled in the art, that the present invention may be practiced without some or all of these specific details. In other instances, well known process operations have not been described in detail in order not to unnecessarily obscure the present invention.

Embodiments described below disclose a high-speed level shifter circuit that translates a 1.1V signal into a 1.8V signal at data rates above 6.5 gigabits per second (Gbps) using a thin gate oxide transistor at the input of the output stage of the level shifter. These embodiments use fewer transistors, which in turn translates into a smaller chip area needed to manufacture the level shifter circuit. The use of the thin gate oxide transistor at the input of the output stage of the level shifter is enabled by managing the voltage stress on the thin gate oxide transistor through the architecture described below.

Figure 1:
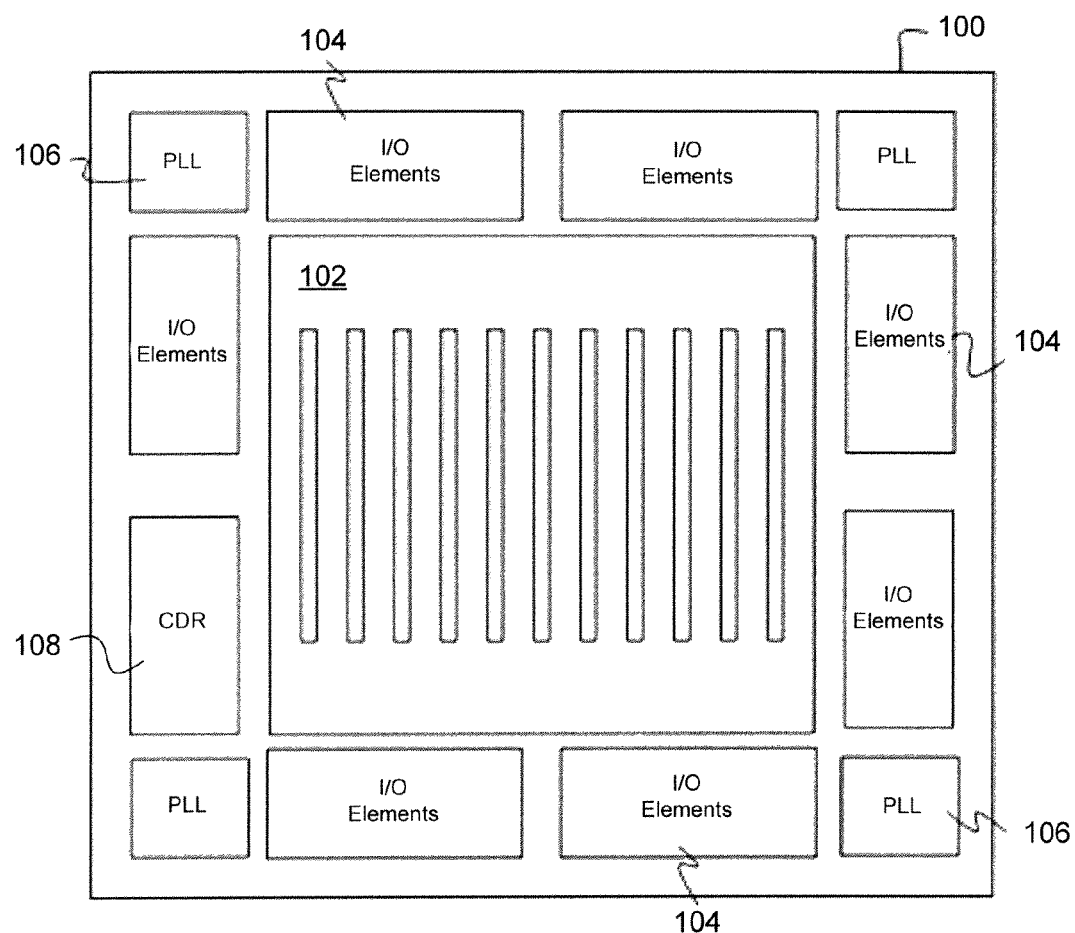
FIG. 1 illustrates a simplified block diagram of a programmable logic device (PLD) that can include aspects of the present invention.

FIG. 1 illustrates a simplified block diagram of a programmable logic device (PLD) that can include aspects of the present invention. Programmable logic device 100 includes core logic region 102 and input/output (I/O) elements 104. Auxiliary circuits such as phase-locked loops (PLLs) 106 for clock generation and timing, can be located outside the core logic region 102, e.g., at corners of the programmable logic device 100 and adjacent to I/O elements 104. Logic region 102 may be populated with logic cells which include logic elements. The logic elements and groups of logic elements can be configured to perform logical functions desired by the user. In one embodiment, the PLD 100 may further include clock data recovery circuits (CDRs) 108. CDRs 108 receive high frequency data from a receiver circuit (not shown) and provide recovered data suitable for routing to the core logic 102 of the programmable logic device 100.

Figure 2:
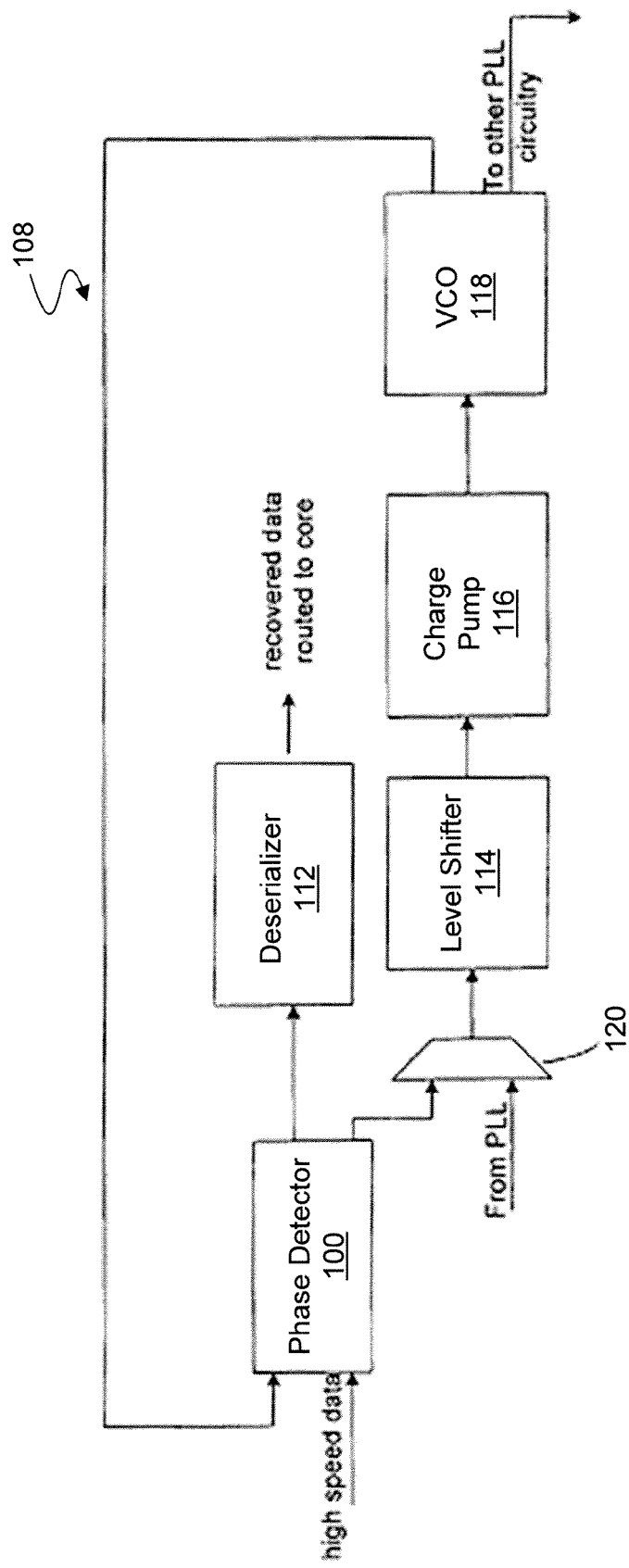
FIG. 2 illustrates a simplified block diagram of a clock data recovery circuit that can include aspects of the present invention.

FIG. 2 illustrates a simplified block diagram of a clock data recovery circuit that can include aspects of the present invention. The CDR 108 includes a phase detector 110, deserializer 112, level shifter circuit 114, charge pump 116, and voltage controlled oscillator (VCO) 118, which are coupled as shown. One skilled in the art will appreciate that certain elements of CDR 108 are also integrated into phase-locked loops. In particular, charge pumps 116 and VCOs 118 are well known PLL elements. Therefore, in this example, multiplexer 120 allows selection between the output of the PLL circuitry (not shown) or the output of the phase detector 110 of the CDR 108 to provide input to level shifter circuit 114. This allows the level shifter circuit 114, charge pump 116, and VCO 118 to be used by either CDR 108 or by a PLL (not shown).

Figure 3:
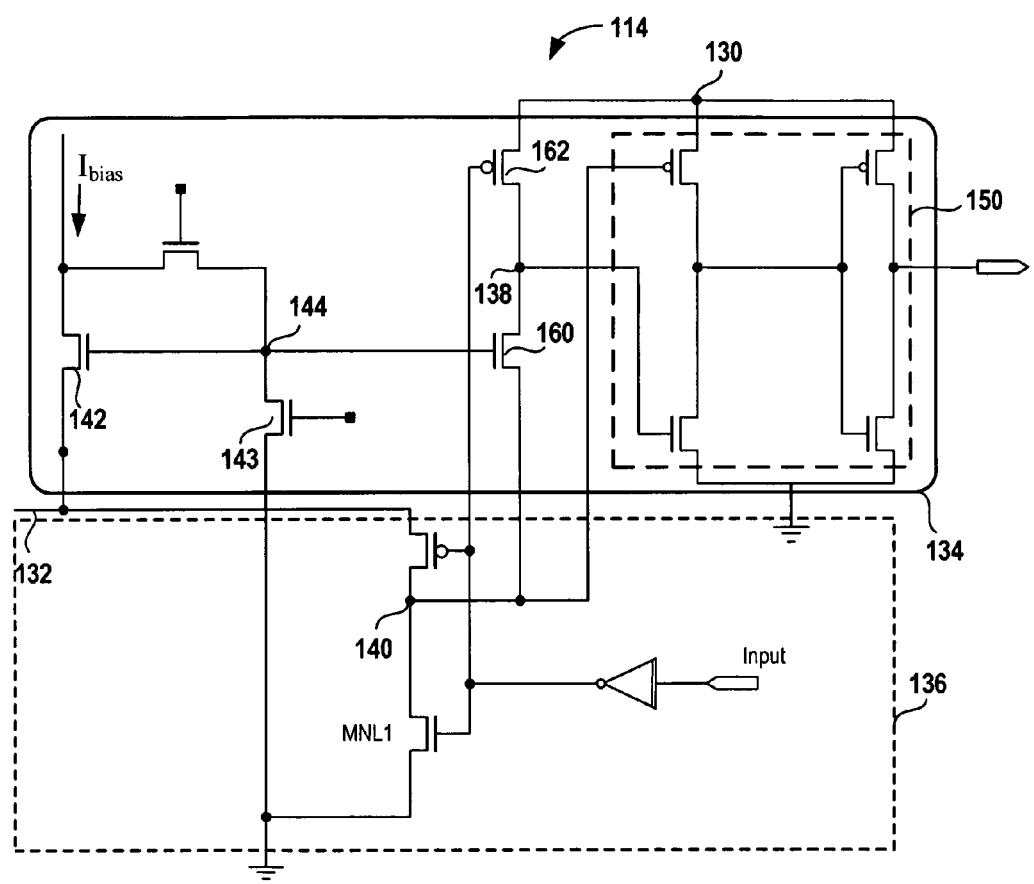
FIG. 3 illustrates a level shifter circuit, in accordance with one embodiment of the present invention.

FIG. 3 illustrates a level shifter circuit, in accordance with one embodiment of the present invention. In many integrated circuits, a high frequency level shifter circuit 114 drives switches in the charge pump circuit of FIG. 2. As discussed above, one function of the level shifter circuit 114 is to receive a high frequency input signal at a first voltage, e.g., 1.1V signal at 6.5 Gbps, and shift the high frequency input signal to a second voltage, e.g., 1.8V. In one embodiment, the level shifter circuit 114 uses two power supply inputs 130 and 132 and a ground. The level shifter circuit 114 can be divided into an output stage 134 and an input stage 136. Typically the output stage 134 of the level shifter includes thick gate oxide, i.e., high threshold voltage, transistors and the input stage 136 includes thin gate oxide, i.e., low threshold voltage, transistors. It should be noted an exemplary thickness of the thick gate oxide is approximately 2.8 nm, which is provided for illustrative purposes and is not limiting. The input signal is the received at a first voltage, e.g. 1.1V, which is then level shifted at the node 138 (input of the output stage 134) to a second voltage, e.g. 1.8V. Therefore the voltage at the node 138 varies between the voltage of power supply 130, and ground (GND).

Thick gate oxide transistor 160 acts to prevent the voltage at node 140 (source of transistor 160) from rising above the voltage of power supply 132 when node 138 (drain of transistor 160) is being pulled to the voltage of power supply 130. In other words, thick gate transistor 160 shields the thin gate oxide transistor MNL1 from being overstressed. One skilled in the art will appreciate a significant source of overstress in transistors occurs when the gate oxide degrades due a large voltage difference being applied between the source and drain terminals of a transistor. To this end, the voltage swing at node 140 is designed to be kept between the voltage of power supply 132 and ground.

As discussed above, thick gate oxide transistors are inherently slower than similarly sized thin gate oxide transistors. For this reason, the thick gate oxide transistors in the level shifter should be sized sufficiently wide to achieve the necessary frequency of operation. One skilled in the art will also appreciate since node 138 determines the performance of the level shifter circuit 114, the performance of the level shifter is limited by the pair of thick gate oxide transistors 160 and 162 that provide the input signal to node 138 of the level shifter circuit 114.

The voltage bias for transistor 160 is generated by transistor 142, which draws a specified amount of current. For example, a typical amount of current drawn by transistor 142 is 25 µA. As discussed above, the bias current drawn by transistor 142 turns on transistor 160, and ground is provided to node 138 when the input signal to the input stage 136 is low, i.e., logical "0".

One skill in the art will appreciate in normal operation of the level shifter circuit 114, transistor 160 is always on. When the input signal to the input stage 136 is high or 1.1V, in this particular case, node 138 is pulled to the voltage of power supply 130. This is because transistor 162 is turned on and transistor MNL1 is turned off when the input to the input stage 136 is high, i.e. logical "1". The voltage at node 138 is then buffered by two inverters 150 of the output stage 134, implemented using thick gate oxide transistors, which transmit the output signal of the level shifter circuit 114. The level shifter also has a "power down" mode, where transistor 143 is turned on, which pulls node 144 (gate of transistor 160) to ground, thereby turning off transistor 160.

Figure 4:
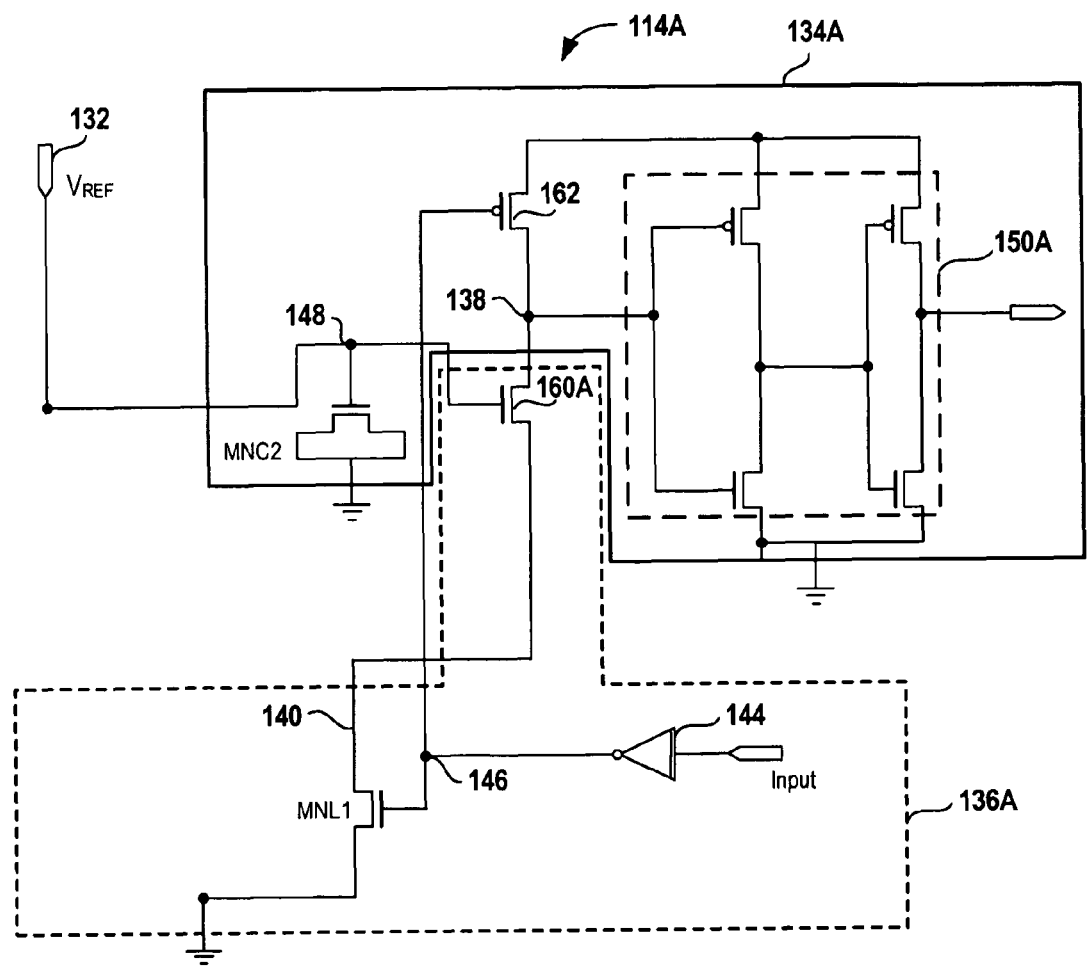
FIG. 4 illustrates a level shifter circuit using a thin gate oxide transistor at the input of the output stage, in accordance with one embodiment of the present invention.

FIG. 4 illustrates a level shifter circuit using a thin gate oxide transistor at the input of the output stage, in accordance with one embodiment of the present invention. It is desirable for level shifter circuit 114A to operate at high frequency, e.g. above 10 Gbps, and at same time minimize power consumption. As discussed with regard to FIG. 3, often the performance of the level shifter is determined by thick gate oxide transistors connected to the input of the output stage 134A. In FIG. 4, node 138 (input to the output stage 134A) is connected to a thin gate oxide transistor 160A, and transistor 160A is biased to the voltage of power supply 132 (reference voltage). In one embodiment, transistor 160A is part of the input stage 136A. In another embodiment, transistor 160A couples the input stage 136A to the output stage 134A.

As with the level shifter circuit of FIG. 3, the voltage swing at node 138 is between the voltage of power supply 130 and ground. For example, a typical voltage of power supply 130 is 1.8V. Additionally, the voltage swing at node 140 is between the approximately the reference voltage minus the threshold voltage of transistor 160A, and ground. As discussed above, the ability to use thin gate oxide transistors at node 138 is dependent on preventing overstress of the thin gate oxide. In one embodiment, to keep the thin gate oxide of transistor 160A from being overstressed, the voltages at the nodes 138 (drain of transistor 160A) and 140 (source node of transistor 160A) are in phase. In other words, when the voltage at node 138 is high, e.g., 1.8V, the voltage at node 140 is high, e.g. approximately 1.1V (the reference voltage) minus the threshold voltage of transistor 160A. Conversely, when the voltage at node 138 of transistor 160A is at ground, the voltage at the node 140 is also at ground. These bias conditions ensure the voltage across the gate, source and drain of transistor 160A are kept within acceptable values at all times. Also, since the voltage at node 140 is limited to the reference voltage minus the threshold voltage of transistor 160, there is no overstress issue on thin oxide transistor MNL1. Therefore, there is no overstress on thin gate oxide transistors 160A and MNL1, even when the node 138 is biased to the voltage of power supply 130, since the voltage difference between the nodes 138 and 140 is at most the difference between the voltage of power supply 132 and the voltage of power supply 130.

One skilled in the art will appreciate the voltage of power supply 132 should be higher than the threshold voltage of transistor 160A. For example, a typical value for the voltage of power supply 132 is approximately 1.1V. In one embodiment the voltage used to bias transistor 160A can be derived from the voltage of power supply 130 instead of using power supply 132. Still further, node 148 (gate of transistor 160A) is coupled to a capacitor MNC2 to reduce the amount of voltage fluctuation on node 148 when biasing transistor 160A, in one embodiment.

The input signal is received by the input, I, of the input stage 136A. The input signal is buffered by an inverter 144 and the voltage at node 146 controls the thin gate oxide transistor MNL1 and the thick gate transistor 162. When the input signal is low, the voltage at node 146 is high and transistor MNL1 is turned on. In one embodiment, transistor 160A and MNL1 are connected in a cascode configuration. Conduction of current by transistor MNL1 biases node 140, and at the same time, transistor 160A is biased to the voltage of power supply 132 causing node 138 (gates of inverters 150A) to be biased to ground. Conversely, when the input signal is high, the voltage at node 146 is low, and thick gate oxide transistor 162 is turned on causing node 138 to be pulled up to the voltage of power supply 130. In addition, when the input signal is high, transistor MNL1 is turned off. As discussed above, one skilled in the art will appreciate under this bias condition, node 140 becomes approximately the voltage at node 148 minus the threshold voltage of transistor 160A. The voltage at node 138 is buffered by the pair of inverters 150A of the output stage 134A, implemented using thick gate oxide devices, and transmitted by the level shifter circuit 114A.

Figure 5:
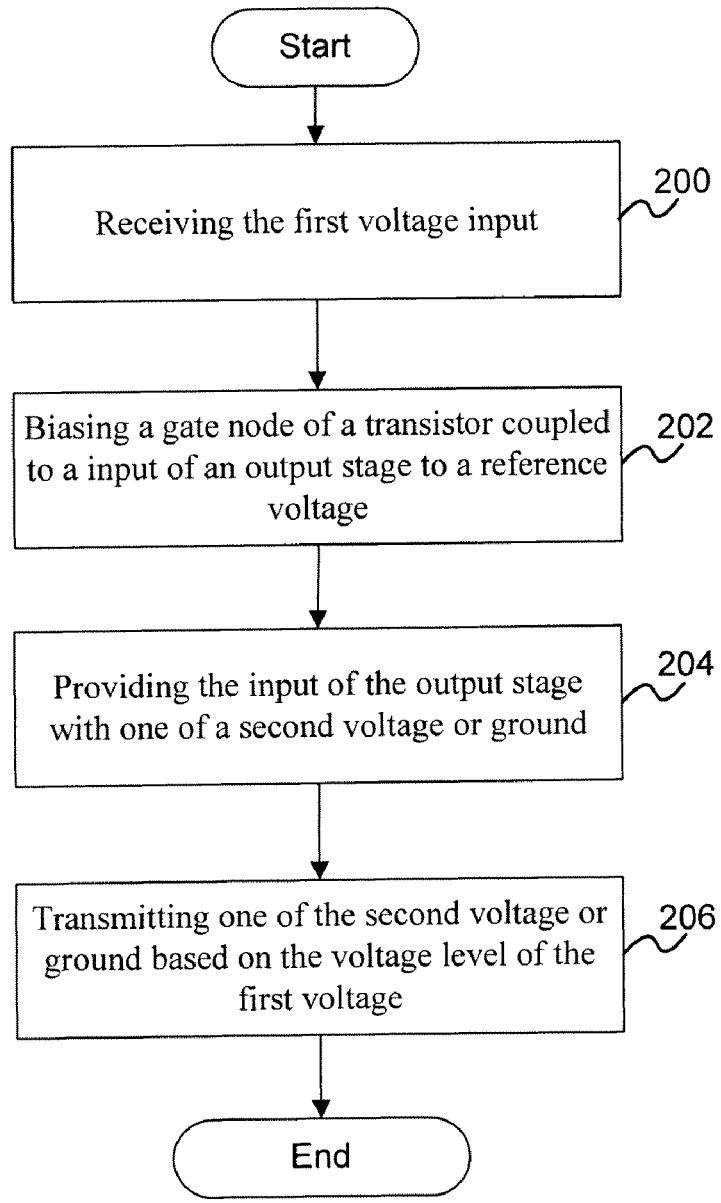
FIG. 5 is a flow chart diagram illustrating method operations for level shifting a first voltage input to an output at a second voltage, in accordance with one embodiment of the present invention.

FIG. 5 is a flow chart diagram illustrating method operations for level shifting a first voltage input to an output at a second voltage, in accordance with one embodiment of the present invention. The method begins with operation 200, in which the level shifter circuit receives the input signal at a first voltage. In operation 202, the gate of the transistor is coupled to the input of the output stage of the level shifter circuit is biased to a reference voltage. In one embodiment, the reference voltage is substantially equal to the first voltage. In another embodiment, the reference voltage is derived from the power supply providing the second voltage to the level shifter, but is substantially equal to the first voltage in value. Still further, as illustrated in FIG. 4, a capacitor coupled to the gate of the transistor reduces glitches in the bias of the transistor, in one embodiment.

The method advances to operation 204, where the signal at the input of the output stage of the level shifter circuit is one of a second voltage or ground, as dictated by the input signal. In one embodiment, as illustrated by node 138 of FIG. 4, the input of the output stage is connected to the drain node of a thin gate oxide transistor. Still further, the input of the output stage is pulled up to the second voltage through a thick gate oxide transistor, in one embodiment. In another embodiment, the bias on the source and drain of the thin gate transistor connected to the input of the output stage, as illustrated in FIG. 4, are in phase. In operation 206, the level shifter circuit transmits either the second voltage or ground as dictated by the input signal. In one embodiment, as illustrated in FIG. 4, the voltage on the input of the output stage is buffered by a pair of inverters implemented using thick gate oxide transistors.

The method and apparatus described herein may be incorporated into any suitable circuit, including processors and programmable logic devices (PLDs). The PLDs can include programmable array logic (PAL), programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by the assignee.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A level shifting circuit comprising:
   an input stage operable to receive an input at a first voltage;
   an output stage having transistors with a gate oxide of a first thickness; and
   a transistor having a first terminal coupled to the input stage and a second terminal coupled to at least one gate of the transistors with the gate oxide of the first thickness, wherein the transistor has a gate oxide thickness less than the first thickness, and
   an input stage transistor coupled to a source node of the transistor with the gate oxide thickness less than the first thickness, and wherein the input at the first voltage is coupled to at least a gate of the transistors with the gate oxide of the first thickness.

2. The level shifting circuit of claim 1, wherein a voltage received at the first terminal of the transistor with the gate oxide thickness less than the first thickness is in phase with a voltage received at the second terminal of the transistor with the gate oxide thickness less than the first thickness when the transistor with the gate oxide thickness less than the first thickness is in an off state.

3. The level shifting circuit of claim 1, further comprising:
   a power supply operable to provide a second voltage to a drain of one of the transistors with the gate oxide of the first thickness.

4. The level shifting circuit of claim 1, wherein a gate node of the transistor with the gate oxide thickness less than the first thickness is operable to be biased to a reference voltage that is greater than a threshold voltage of the transistor with the gate oxide thickness less than the first thickness.

5. The level shifting circuit of claim 1, wherein the input stage further comprises:
   an inverter having an output coupled to a gate of one of the transistors with the gate oxide of the first thickness.

6. The level shifting circuit of claim 1, wherein the output stage further comprises:
   an inverter coupled to the drain of the transistor with the gate oxide thickness less than the first thickness.

7. A level shifting circuit, comprising:
   an input stage operable to receive a voltage input, wherein the input stage comprises a first transistor and a second transistor; and
   an output stage comprising an output stage transistor,
   wherein the first transistor is coupled to an input terminal of the output stage, wherein, when the first transistor is in an off state, a voltage received at the input terminal of the output stage is in phase with a voltage received at a drain terminal of the first transistor; and wherein a terminal of the second transistor is coupled to a source terminal of the first transistor, a gate of the second transistor is coupled to the voltage input through an inverter, wherein the voltage input is coupled to a gate of the output stage transistor, and wherein the input stage is operable to bias gates of a plurality of inverters of the output stage to ground based on a voltage level of the voltage input applied to the gate of the second transistor.

8. The level shifting circuit of claim 7, wherein the inverter includes a plurality of transistors having a gate oxide thickness less than a gate oxide thickness of the output stage transistor.

9. The level shifting circuit of claim 7, wherein a gate of the first transistor has a gate oxide thickness less than a gate oxide thickness of the output stage transistor, and wherein a gate of the first transistor is biased to a reference voltage that is greater than a threshold voltage of the first transistor.

10. The level shifting circuit of claim 7, further comprising:
    a capacitor coupled to a gate of the first transistor.

11. The level shifting circuit of claim 7, wherein the output stage transistor has a first terminal coupled to a power supply and a second terminal coupled to the input terminal of the output stage.

12. The level shifting circuit of claim 7, wherein the source terminal of the first transistor is coupled to a terminal of the second transistor in a cascode configuration.

13. A method of level shifting voltage inputs, the method comprising:
    receiving at an input stage a first input at a first voltage;
    receiving at an output stage a second input at a second voltage;
    biasing a gate of a transistor coupled to an input terminal of the output stage with a third voltage;
    providing the input terminal of the output stage with one of the second voltage or ground, such that a voltage at the input terminal of the output stage is in phase with a voltage at a source of the transistor when the transistor is in an off state, wherein the voltage at the input terminal and the voltage at the source originate from different voltage sources; and
    transmitting one of the second voltage or ground from the output stage based on a voltage level of the first voltage; and
    transmitting the first input to a gate of a transistor of the output stage, wherein a thickness of a gate oxide of the transistor coupled to the input terminal of the output stage is less than a thickness of a gate oxide of the transistor of the output stage.

14. The method of level shifting of claim 13, further comprising:
    coupling the source of the transistor coupled to the input terminal of the output stage to a drain of a transistor of the input stage.

15. The method of level shifting of claim 13, further comprising:
    transmitting the third voltage from a power supply providing the second voltage.

16. The method of level shifting of claim 13, further comprising:
    buffering one of the second voltage or ground using a plurality of inverters.

17. The method of level shifting of claim 13, wherein the biasing further comprises:
    biasing the source of the transistor coupled to the input terminal of the output stage to a level substantially equal to the reference voltage when the input of the output stage is biased to the second voltage.

18. The method of level shifting of claim 13, wherein the second voltage is higher than the first voltage.

* * * * *